(12) United States Patent
Chen

(10) Patent No.: US 6,784,702 B1
(45) Date of Patent: Aug. 31, 2004

(54) DRIVER CIRCUIT WITH DYNAMICALLY ADJUSTING OUTPUT CURRENT AND INPUT CURRENT-LIMITING FUNCTION

(75) Inventor: Chieh-Hsiang Chen, Hsinchu (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 10/428,832

(22) Filed: May 5, 2003

(51) Int. Cl.⁷ ................................................ H03B 1/10
(52) U.S. Cl. ...................... 327/110; 327/315; 327/319; 327/322; 327/538
(58) Field of Search .................... 327/108, 110, 327/307, 309, 315, 316, 318, 319, 321, 322, 323, 327, 328, 530, 534, 535, 538, 540, 541, 543

(56) References Cited

U.S. PATENT DOCUMENTS

| | | | | | |
|---|---|---|---|---|---|
| 5,543,745 A | * | 8/1996 | Notani | ....................... | 327/538 |
| 5,631,595 A | * | 5/1997 | Lakshmikumar | ............ | 327/362 |
| 5,886,570 A | * | 3/1999 | Brokaw | ....................... | 327/540 |
| 5,955,792 A | * | 9/1999 | Fischer et al. | ................. | 307/87 |
| 6,107,868 A | * | 8/2000 | Diniz et al. | .................. | 327/543 |

* cited by examiner

Primary Examiner—Jeffrey S. Zweizig

(57) ABSTRACT

The present invention provides a Driver circuit having dynamically adjusting output current and limiting input current function. This present invention dynamically adjusts the output current provided by the driver unit to reduce this output current in real time. A protection circuit is also provided to limit the input current supplied to the driver unit. This present invention avoids overdriving the driver unit.

21 Claims, 8 Drawing Sheets

DRIVER CIRCUIT WITH DYNAMICALLY ADJUSTING OUTPUT CURRENT AND INPUT CURRENT-LIMITING FUNCTION

BACKGROUND OF THE INVENTION

1. Field of Invention

The present invention relates to a current driver for driving a load requiring high current, and more particularly to a dynamically adjusting current driver that prevents overdriving the load by limiting the input current and dynamically detecting the output current.

2. Description of Related Art

Bipolar driver circuits are often used to drive loads having high current requirements. For example, in applications in which the load is a motor, relatively high currents are often required during acceleration and deceleration. This technology is described in U.S. Pat. No. 5,684,427. However, the circuit structure disclosed in this patent does not include a protection circuit to avoid overdriving the load. In other words, the circuit structure disclosed in U.S. Pat. No. 5,684,427 is not able to control the input current supplied to the load. Therefore, an overdrived load due to excess input current often happens.

On the other hand, a relatively large current may flow through the source pin of the load when the driver circuit drives the load. A control signal is used to switch the current flowing through the load. This current switch may cause an electromagnetic induction effect to generate an additional current and voltage noises in the circuit structure. The relationship between the current and the voltage is shown as follows:

$$i = \frac{1}{L}\int v\,dt$$

$$v = L \times \frac{di}{dt}$$

L is the inductance of the load. The electromagnetic inductive effect often causes a large current and voltage noises at the output end of the driver circuit because of the inherent large inductance of the load. In other words, the current and voltage value at the output end of the driver circuit is not the authorized value. This noise also causes overdriving load situation.

The lack of a protection circuit may cause the excess input current to overdrive the driver circuit. On the other hand, the inherent large inductance of the load may also generate a large current and voltage noises at the output end of the driver circuit because of the electromagnetic induction effect. Therefore, a new circuit structure is required to avoid the above drawbacks. This driver circuit structure provides a protection function at the input end to avoid the excess input current and provides a dynamic detection function at the output end to avoid exceeding the authorized value for the output current and voltage value.

SUMMARY OF THE INVENTION

According to the above descriptions, a large current is often input into the conventional driver circuit. Because there is no protection apparatus in the driver circuit, the large input current may cause an overdrive situation. On the other hand, the huge loading has an inherent inductor that may generate an additional current and voltage at the output end of the driver circuit during discharge and charge phases. Therefore, the present invention provides a circuit design having a protection circuit at the input end and having the function of dynamically adjusting the current at the output end. The circuit structure of the present invention reduces the output current when the output current is over an authorized value in real time. On the other hand, the protection circuit existing in the present invention limits the current input to the circuit to avoid an overdrive situation.

In accordance with the above description, the main purpose of the present invention is to provide a driver circuit apparatus having the function of dynamically adjusting the output current at the output end. This function reduces the output current in real time when the output current is over an authorized value. This function avoids a sudden rise in the output current.

Another purpose of the present invention is to provide a driver circuit apparatus having a protection circuit. The protection circuit may limit the current input into the driver circuit to avoid an overdrive situation.

In accordance with the purpose described in the above paragraphs, the driver circuit of the present invention includes three units, an input current limiting unit located at the input end of the driver circuit, a load driver unit and an output current detection and dynamic adjustment unit located at the output end of the driver circuit. The input current limiting unit limits the current input into the driver circuit within an authorized value. This limiting unit avoids an excess current being input into the load driver unit. The load driver unit receives the current transferred from the input current limiting unit to generate a drive current to drive the load. The output current detection and dynamic adjustment unit is used to detect the drive current of the load driver unit and converts the drive current to a voltage signal, which is compared with a reference voltage. The output current detection and dynamic adjustment unit does not adjust the drive current of the load driver unit if the voltage signal is less than the reference voltage. On the contrary, the output current detection and dynamic adjustment unit reduces the drive current of the load driver unit to avoid the overdrive situation if the voltage signal is larger than the reference voltage.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

Without limiting the spirit and scope of the present invention, the circuit structure proposed in the present invention is illustrated with one preferred embodiment. Skilled artisans, upon acknowledging the embodiments, can apply the circuit structure of the present invention to any kind of driver circuit to avoid generating an extra current except for the authorized current at the output end because of lack of a dynamically adjusting apparatus therein. On the other hand, a protection unit is also provided at the input end of the circuit structure in the present invention to limit the current input into the driver circuit to avoid an overdrive situation.

A preferred embodiment is described in the following to introduce the application of the present invention. The application of the present invention is not limited by the following description.

Figure 1:
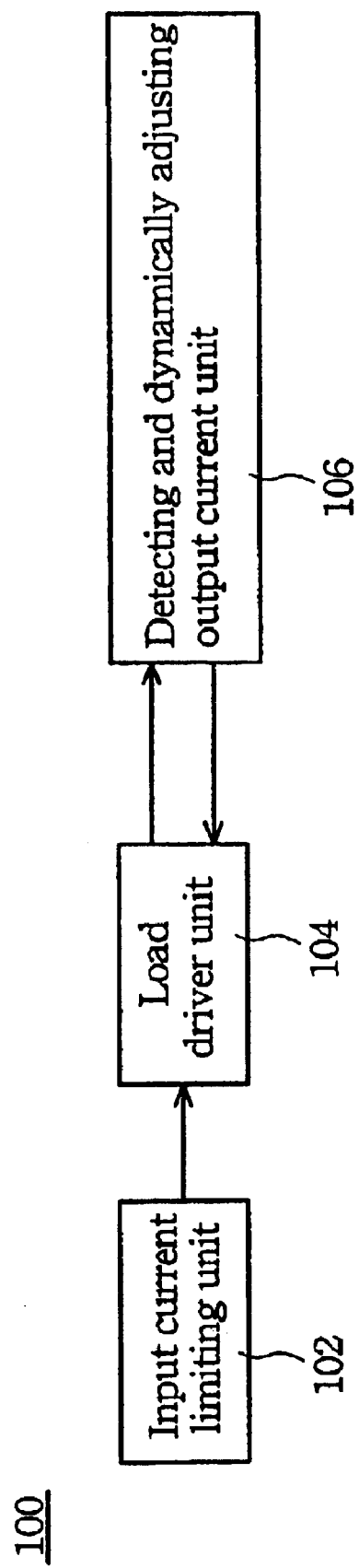
FIG. 1 is a schematic diagram of a driver circuit structure with a protection unit and an output current dynamic adjustment unit in accordance with a preferred embodiment of the present invention.

FIG. 1 shows a schematic diagram of a driver circuit 100 with a protection unit and a dynamically adjusting output current unit in accordance with the preferred embodiment of the present invention. The driver circuit of the present invention includes three units, the input current limiting unit 102 located at the input end of the driver circuit 100, the load driver unit 104 and the output current detection and dynamic adjustment unit 106 located at the output end of the driver circuit. The input current limiting unit 102 limits the current input into the driver circuit to an authorized value. This limiting unit 102 avoids an excessively large current being input into the load driver unit 104. The load driver unit 104 receives the current transferred from the input current limiting unit 102 to generate a drive current to drive the load. The output current detection and dynamic adjustment unit 106 is used to detect the drive current of the load driver unit 104 and converts the drive current to a voltage signal which is compared with a reference voltage. The output current detection and dynamic adjustment unit 106 does not adjust the drive current of the load driver unit 104 if the voltage signal is less than the reference voltage. On the contrary, the output current detection and dynamic adjustment unit 106 reduces the drive current of the load driver unit 104 to avoid the overdrive situation if the voltage signal is larger than the reference voltage.

Figure 2A:
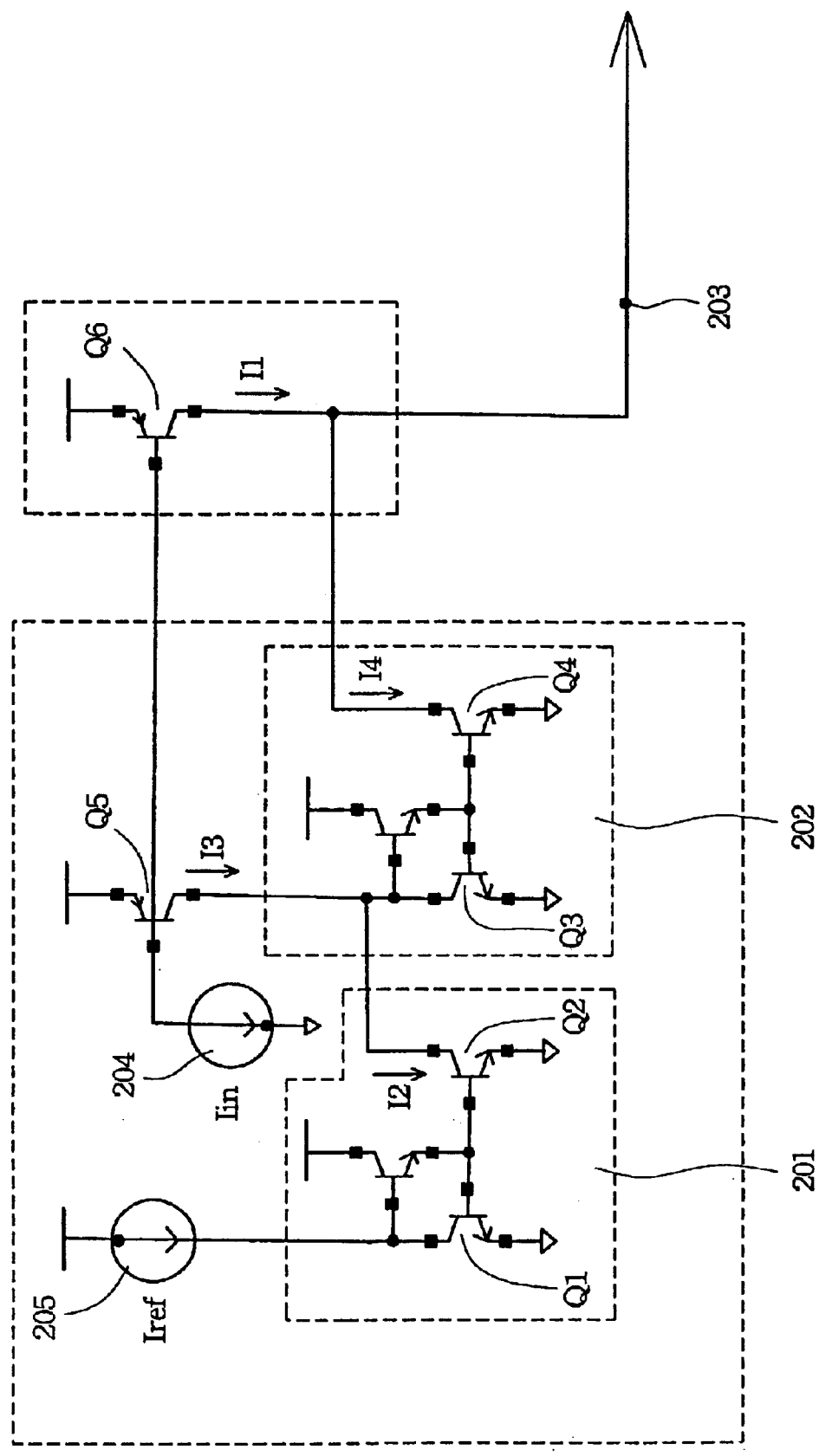
FIG. 2A is a detailed circuit structure of the input current limiting unit in accordance with the preferred embodiment of the present invention.

Referring to FIG. 1 and FIG. 2A together, FIG. 2A is a detailed circuit structure of the input current limiting unit 102 in accordance with the preferred embodiment of the present invention. The input current limiting unit 102 is composed of two current mirrors 201 and 202. The output end 203 of the input current limiting unit 102 sends a current to the load driver unit 104 as the input current. The function of the input current limiting unit 102 serves as a protection apparatus. In other words, the acceptable current is 10 units at the output end 203 if the reference current source $I_{ref}$ 205 of the current mirror 201 is 10 units. Therefore, the current at the output end 203 of the input current limiting unit 102 is limited to 10 or fewer units. For example, if the current at the output end 203 is over 10 units, the input current limiting unit 102 of the present invention provides an additional current route to conduct the excess current. Such additional current route ensures the current at the output end 203 to be equal to or less than 10 units.

The reference current source $I_{ref}$ 205 of the current mirror 201 is 10 units. The current $I_1$ conducted from the current source $I_{in}$ is 12 units and is clearly in excess of the authorized current if the current $I_1$ is conducted to the output end 203. Therefore, the present invention provides an additional current route to conduct out the excess current of 2 units. If the transistor $Q_1$ and the transistor $Q_2$ of the current mirror 201 are the same, the current of the current source $I_{ref}$ 205 responds to the collector electrode of the transistor $Q_2$ in accordance with the basic current principle of the current mirror. The current $I_2$ in the collector electrode is equal to the current of the current source $I_{ref}$, 10 units. On the other hand, the transistor $Q_5$ and the transistor $Q_6$ are the same. The base electrodes of the transistor $Q_5$ and the transistor $Q_6$ are both connected to the current source $I_{in}$; therefore, the current $I_3$ in the collector electrode of the transistor $Q_5$ is also 12 units. At this time, the current flowing into the current mirror 202 is only 2 units.

If the transistor $Q_3$ and the transistor $Q_4$ of the current mirror 202 are the same, the 2 unit current flowing into the collector electrode of the transistor $Q_3$ also responds to the collector electrode of the transistor $Q_4$ in accordance with the basic current principle of the current mirror. That is, the current $I_4$ in the collector electrode of the transistor $Q_4$ is also 2 units. Therefore, the current at the output end 203 is maintained at 10 units. Such protection function of the driver circuit avoids generation of excess current at the output end 203 to cause an overdrive situation of the load driver unit 104. On the other hand, if the current $I_1$ conducted by the current source $I_{in}$ 204 is only 9 units, the additional current route provided by the current mirror 202 does not work. Therefore, the current at the output end 203 is still 9 units.

Figure 2B:
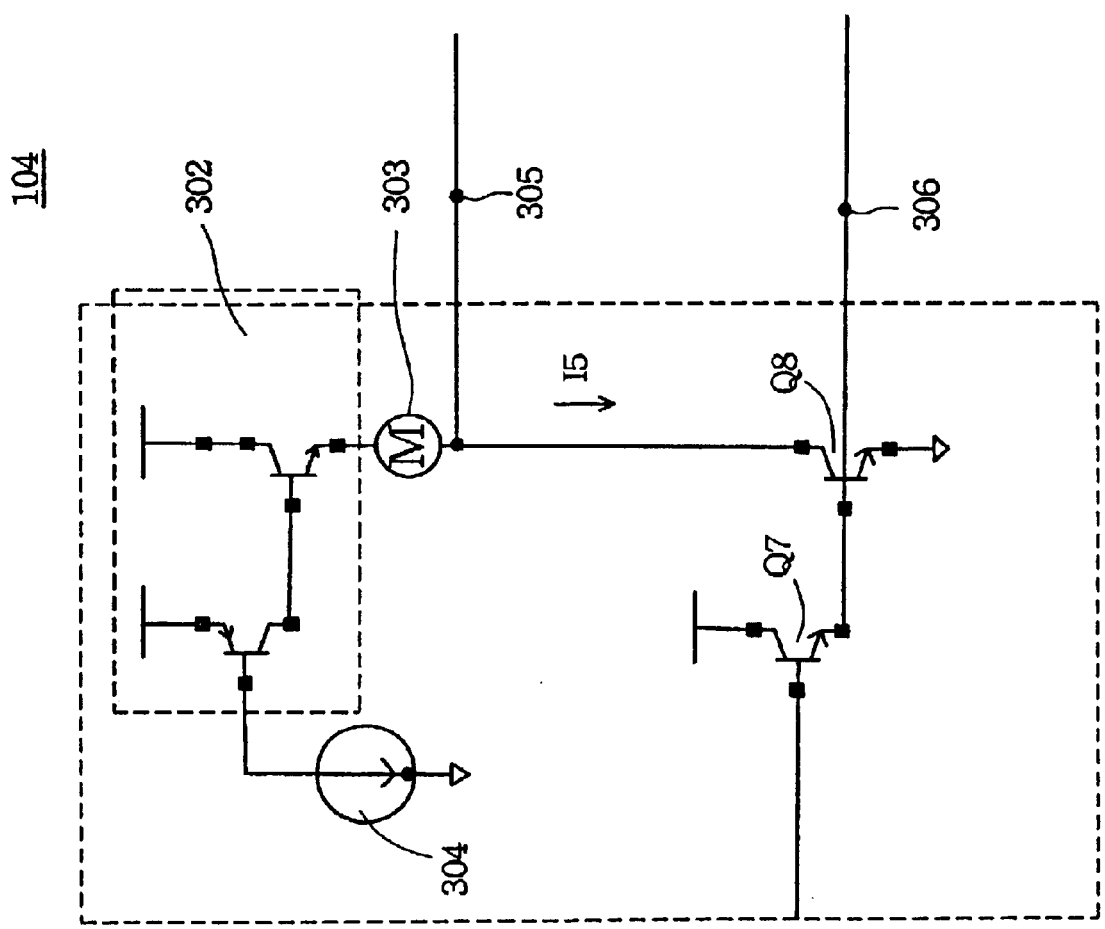
FIG. 2B is a detailed circuit structure of the load driver unit in accordance with the preferred embodiment of the present invention.

Referring to FIG. 1 and FIG. 2B, FIG. 2B is a detailed circuit structure of the load driver unit 104 in accordance with the preferred embodiment of the present invention. The load driver unit 104 is at least composed of a Darlington pair 302 that is used to drive the load 303. The load 303 can be a motor or other apparatus requiring a huge drive current. A current source 304 is connected to the Darlington pair 302 that enlarges the current transferred from the current source 304. The enlarged current is supplied to the load 303. The driving current generated by the Darlington pair 302 is controlled by the transistor $Q_7$ and the transistor $Q_8$. The base electrode of the transistor $Q_7$ is connected to the output end 203 to receive the output current from the input current limiting unit 102. The received current is enlarged by the transistor $Q_7$. The enlarged current is supplied to the base electrode of the transistor $Q_8$. The output current $I_5$ from the Darlington pair 302 is controlled by the base current of the transistor $Q_8$.

The load 303 requires a huge drive current. Therefore, there is an inherent huge inductance therein. On the other hand, the charge and discharge process when driving the load may cause the electromagnetic inductive to form additional current and voltage noise. In other words, the drive current supplied to the load 303 is composed of the drive current $I_5$ generated by the Darlington pair 303 and the induction current generated by the load. An overdrive situation of the load 303 occurs if the inductive current exceeds a specific value. Therefore, the output current detection and dynamic adjustment unit 106 is built at the output end of the load driver unit 104 to detect the output current of the load 303. In other words, the output current detection and dynamic adjustment unit 106 is connected with the output ends 305 and 306 of the load driver unit 104, respectively.

The output end 305 is detected to determine the output current of the load 303. This output current is composed of the drive current $I_5$ and the induction current generated by the load. At the output end 306, the drive current $I_5$ is controlled by adjusting the base current of the transistor $Q_8$. Such adjustment of the drive current $I_5$ avoids the overdrive situation because the adjusted drive current $I_5$ compensates for generation of the inductive current. The detected output current of the load is transferred to a voltage signal for comparison with a reference voltage value set before. The comparison result is used to adjust the base current of the transistor $Q_8$.

Figure 2C:
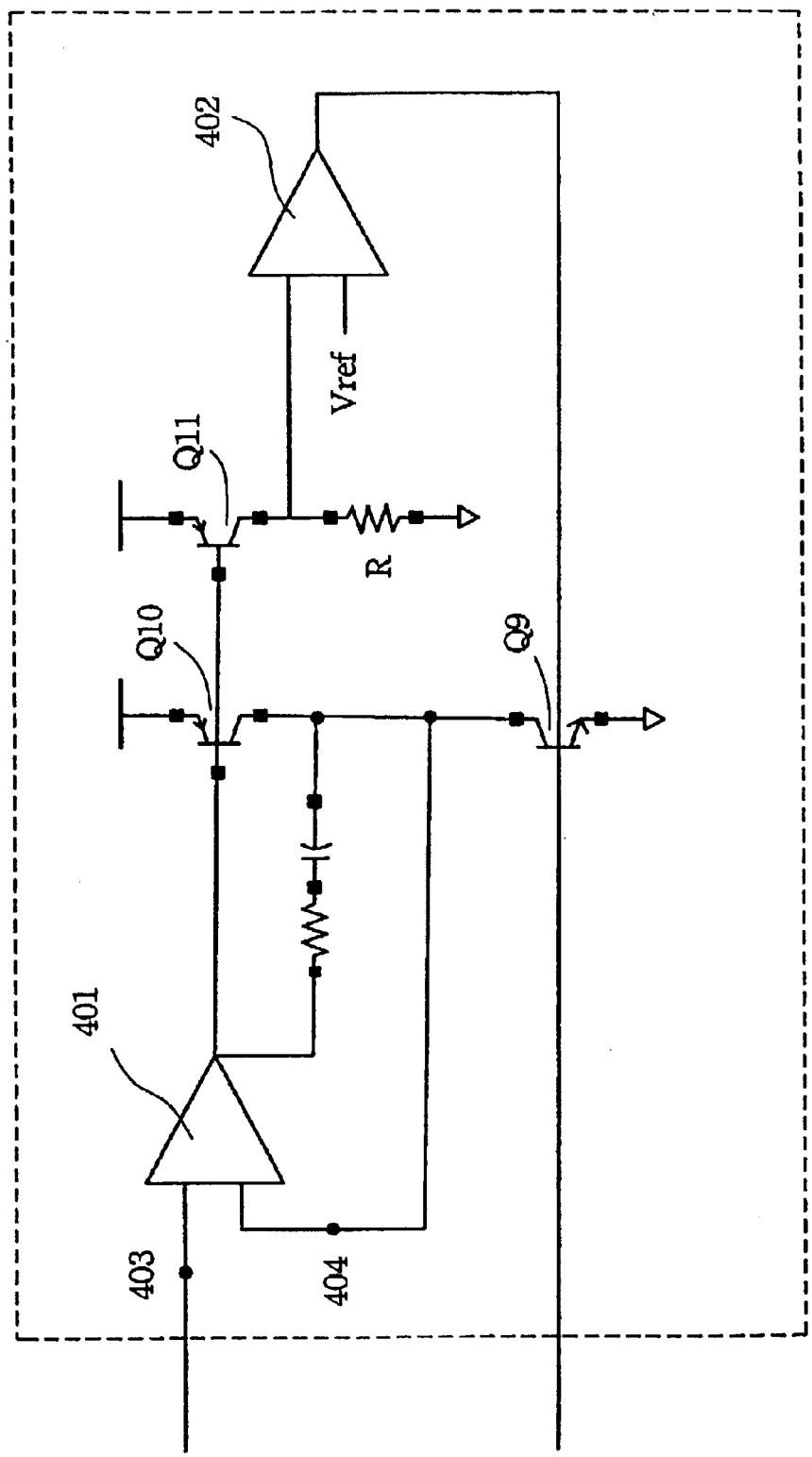
FIG. 2C is a detailed circuit structure of the output current detection and dynamic adjustment unit in accordance with the preferred embodiment of the present invention.

Referring to the FIGS. 1, 2B and 2C, FIG. 2C is a detailed circuit structure of the output current detection and dynamic adjustment unit 106 in accordance with the preferred embodiment of the present invention. The unit is at least composed of an operation amplifier 401 and a comparator 402. The input end 403 of the operation amplifier 401 is connected with the output end 305 of the load driver unit 104. The other input end 404 is connected with the collector electrode of the transistor $Q_9$. The base electrode of the transistor $Q_9$ is connected with the base electrode of the transistor $Q_8$. On the other hand, a reference voltage $V_{ref}$ is applied to one end of the comparator 402 for comparison with a voltage signal that is converted from an output current of the load. The comparison result is used to adjust the base current of the transistor $Q_8$. The reference voltage is related to the maximum acceptable drive current of the load driver unit 104. In other words, the sum of the drive current $I_5$ supplied by the Darlington pair 302 and the inductive current generated by the load has to be less than or equal to the maximum acceptable drive current.

The output current detection and dynamic adjustment unit 106 is used to detect whether or not the output current output from the load driver unit 104 exceeds a specific value set before. Therefore, the output current of the load is imaged to the other input end of the comparator 402 for comparison with the reference voltage in this present invention. The following paragraph describes the imaging procedure.

Input end 403 of the operation amplifier 401 is connected with the output end 305 of the load driver unit 104 to detect the output current from the load. Input end 404 of the operation amplifier 401 is connected with the collector electrode of the transistor $Q_9$. The base electrode of the transistor $Q_9$ is connected with the base electrode of the transistor $Q_8$. There is no current flowing into the two input ends of the amplifier 401 because the input resistance of the amplifier 401 is almost infinitive. The gain of the amplifier 401 is almost infinitive. Therefore, the voltages at the two input ends are equal. In other words, the voltage $V_{CE}$ between the collector electrode and the emitter electrode applied to the transistor $Q_9$ and the transistor $Q_8$ is same.

Figure 3:
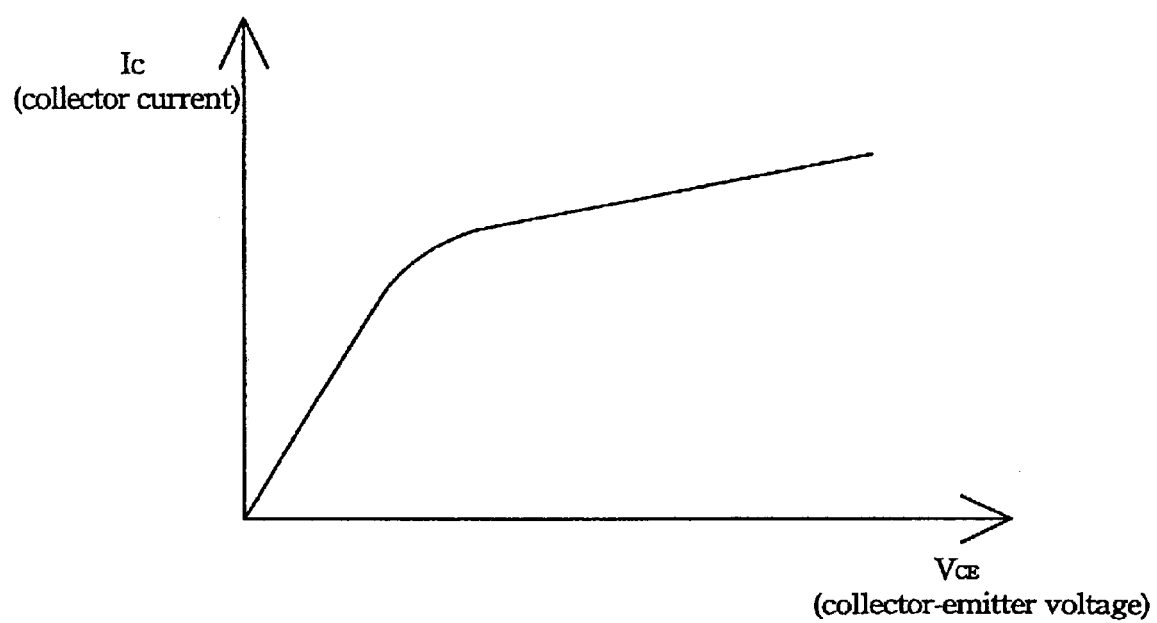
FIG. 3 is a chart of the collector current and the collector-emitter voltage in accordance with the present invention.

FIG. 3 is a chart comparing the collector current ($I_C$) and the collector-emitter voltage ($V_{CE}$) of the bipolar junction transistor. The collector current $I_C$ is raised when the collector-emitter voltage $V_{CE}$ is raised. Therefore, this present invention utilizes the characteristic of the operation amplifier 401 having the same voltage between the two input ends 403 and 404 to make the collector-emitter voltage ($V_{CE}$) respectively applied to the transistor $Q_9$ and the transistor $Q_8$ be the same. On the other hand, the base electrode of the transistor $Q_9$ is connected with the base electrode of the transistor $Q_8$. The transistor $Q_9$ and the transistor $Q_8$ both use the same design rule except the junction area. Therefore, the ratio of the collector currents is equal to the ratio of the junction size of the transistor $Q_9$ and the transistor $Q_8$. On the other hand, the base electrodes of the transistor $Q_{10}$ and the transistor $Q_{11}$ are both connected to the output end of the operation amplifier 401. A voltage is applied to the emitter electrodes of the transistor $Q_{10}$ and the transistor $Q_{11}$ respectively. Therefore, the two transistors form a current mirror structure. Similarly, if the transistor $Q_{10}$ and the transistor $Q_{11}$ both use the same design rule except for the junction area, the ratio of the collector currents is equal to the ratio of the junction size in the transistor $Q_{10}$ and the transistor $Q_{11}$.

On the other hand, a resistor is connected to the collector electrode of the transistor $Q_{11}$. The main purpose of the resistor is to convert the collector current of the transistor $Q_{11}$ to a voltage. This voltage is compared with a reference voltage $V_{ref}$ through a comparator 402. It is noticed that the voltage V is determined by setting the resistor and the areas of the transistors. The value of the voltage V is shown as follows:

$$V = I \cdot R$$

I is the collector current of the transistor $Q_{11}$. R is the resistor connected to the collector electrode of the transistor $Q_{11}$. The output current from the load 303 (shown in the FIG. 2B) is in the acceptable range if the voltage generated by the collector current flowing into the resistor is less than the reference voltage $V_{ref}$, which does not cause an overdrive situation. On the contrary, the output current from the load 303 (shown in the FIG. 2B) is not in the acceptable range if the voltage generated by the collector current flowing into the resistor is larger than the reference voltage $V_{ref}$, which causes the overdrive situation. The output current from the load is composed of the drive current $I_5$ and the induction current generated by the load.

Figure 4:
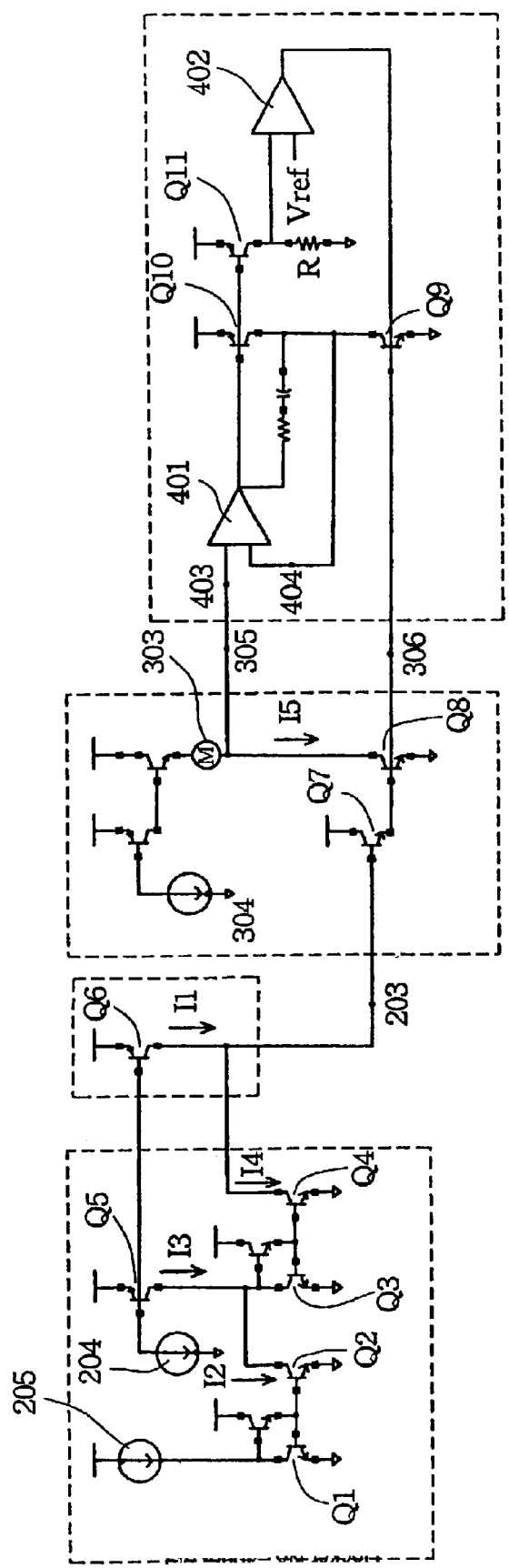
FIG. 4 is a detailed structure of the driver circuit with a protection unit and a dynamically adjusting output current unit in accordance with the preferred embodiment of the present invention.

The comparator 402 starts to work when the voltage generated by the collector current flowing into the resistor is larger than the reference voltage $V_{ref}$. In accordance with the operation principle, the comparator works as a sink current source and provides an additional current route to the transistor $Q_8$ and the transistor $Q_9$. In other words, a part of the base current of the transistor $Q_8$ and the transistor $Q_9$ may flow into the sink current source, which reduces the base current. The collector current $I_5$ is generated by the base current of the transistor $Q_8$. Therefore, the collector current $I_5$ is reduced when the base current of the transistor $Q_8$ is reduced. Referring to FIG. 4, such adjustment of the collector current $I_5$ avoids an overdrive situation even though the load generates an additional inductive current.

FIG. 4 is a detailed structure of the driver circuit with a protection unit and an output current detection and dynamic adjustment unit in accordance with the preferred embodiment of the present invention. Supposing the maximum acceptable drive current in the FIG. 4 is 100 units. In this situation, the collector current of the transistor $Q_8$ is 100 units. In accordance with the present invention, the transistor $Q_8$ and the transistor $Q_9$ both use the same design rule with the exception of the junction area. There is a ratio relationship between the junction areas of transistor $Q_8$ and transistor $Q_9$. If the ratio of the junction areas of the transistor $Q_8$ and the transistor $Q_9$ is 100 to 1, the ratio of the collector current of the two transistors is also 100 to 1. Therefore, the collector current of the transistor $Q_9$ is 1 unit. The ratio of the junction areas can be adjusted.

On the other hand, the base electrodes of the transistor Q and the transistor $Q_{11}$ are both connected to the output end of the operation amplifier 401. A voltage is applied to the emitter electrodes of the transistor $Q_{10}$ and the transistor $Q_{11}$ respectively. Therefore, the two transistors form a current mirror structure. The transistor $Q_{10}$ and the transistor $Q_{11}$ both use the same design rule with the exception of the junction areas. A ratio relationship between the junction areas of transistor $Q_{10}$ and transistor $Q_{11}$ is 10 to 1. The ratio of the junction areas may be adjusted. The collector current of the transistor $Q_{10}$ is equal to the collector current of the transistor $Q_9$, which is about 1 unit. Therefore, the collector current of the transistor $Q_{11}$ is about 0.1 unit. In other words, the ratio of the collector currents of the transistor $Q_8$ and the transistor $Q_{11}$ is 1000 to 1 in accordance with the above current design. If the maximum acceptable drive current flowing into the load is 100 units, the collector current of the transistor $Q_{11}$ flowing into the resistor R should be under 0.1 unit. The comparator 402 will not be triggered by a current under 0.1 unit.

Therefore, if the drive current $I_5$ is 100 units and the inductive current generated by the load is 10 units, the collector current of the transistor $Q_{11}$ is 0.11 unit, which exceeds the acceptable current of 0.1 unit. At this time, the comparator 402 is triggered to provide an additional current route. The current route reduces the base currents of the transistor $Q_8$ and the transistor $Q_9$. Therefore, the collector current $I_5$ is reduced when the base current of the transistor $Q_8$ is reduced. Such adjustment of the collector current $I_5$ avoids an overdrive situation even though the load generates an additional inductive current. Similarly, the collector current of the transistor $Q_{11}$ is reduced when the collector current of the transistor $Q_{10}$ is reduced. The comparator 402 stops working when the collector current of the transistor $Q_{11}$ keeps in 0.1 unit again, which means the total current supplied to the load is kept at 100 units.

Figure 5:
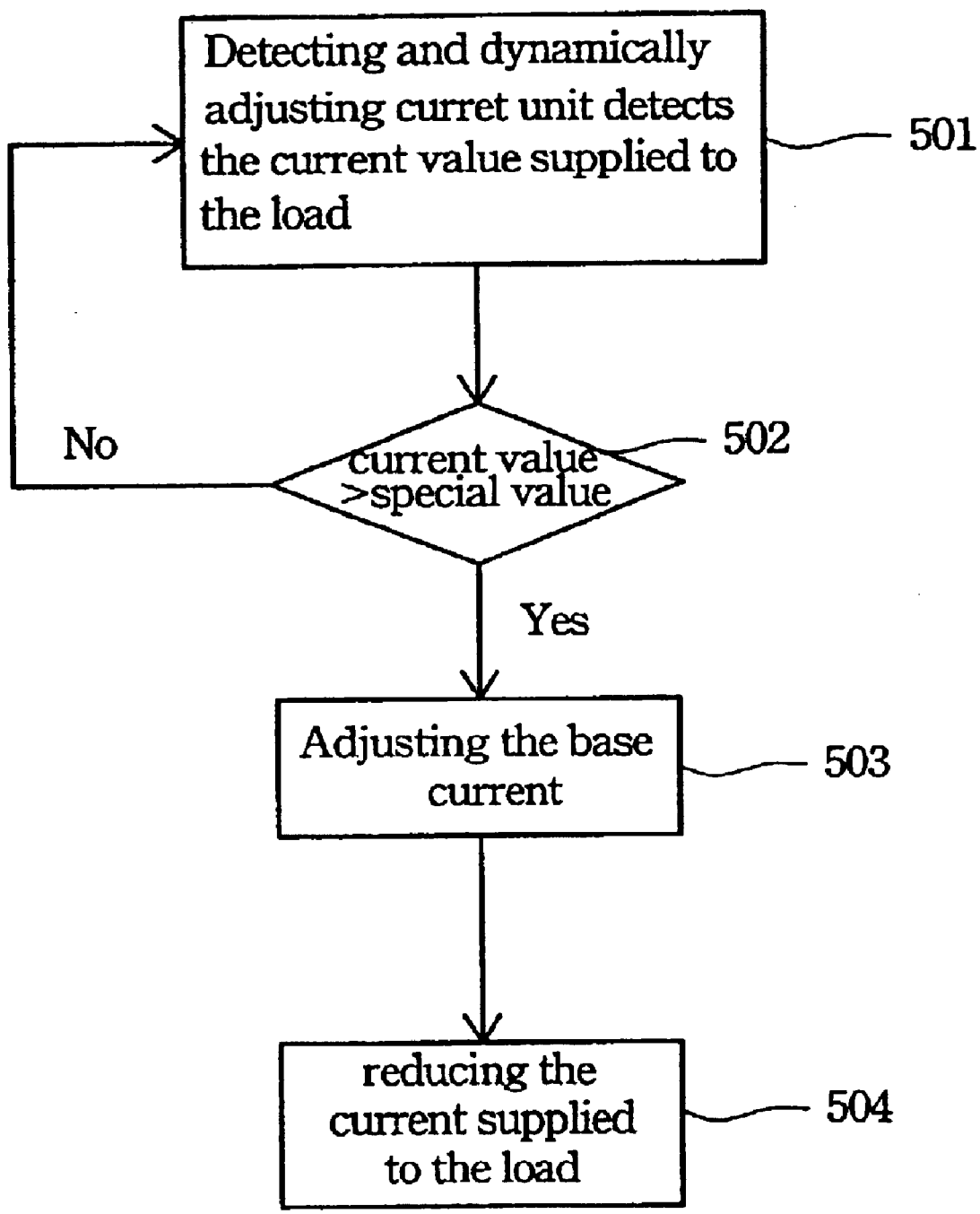
FIG. 5 is a flow chart of dynamically adjusting the current supplied to the load in accordance with the present invention.

FIG. 5 is a flow chart for dynamically adjusting the current supplied to the load in accordance with the present invention. First, the output current detection and dynamic adjustment unit 106 detects the current supplied to the load in step 501. Step 502 determines whether or not the detected current is larger than a special value. The user can set the special value in accordance with the maximum acceptable current for driving the load. If the detected current is less than the special value, step 501 is performed again to detect the current supplied to the load. On the contrary, if the detected current is larger than the special value, step 503 is performed to trigger a comparator to provide an additional current route. This additional current route reduces the base current of the transistor $Q_8$. In step 504, the current supplied to the load is reduced when the base current of the transistor $Q_8$ is reduced.

Figure 6:
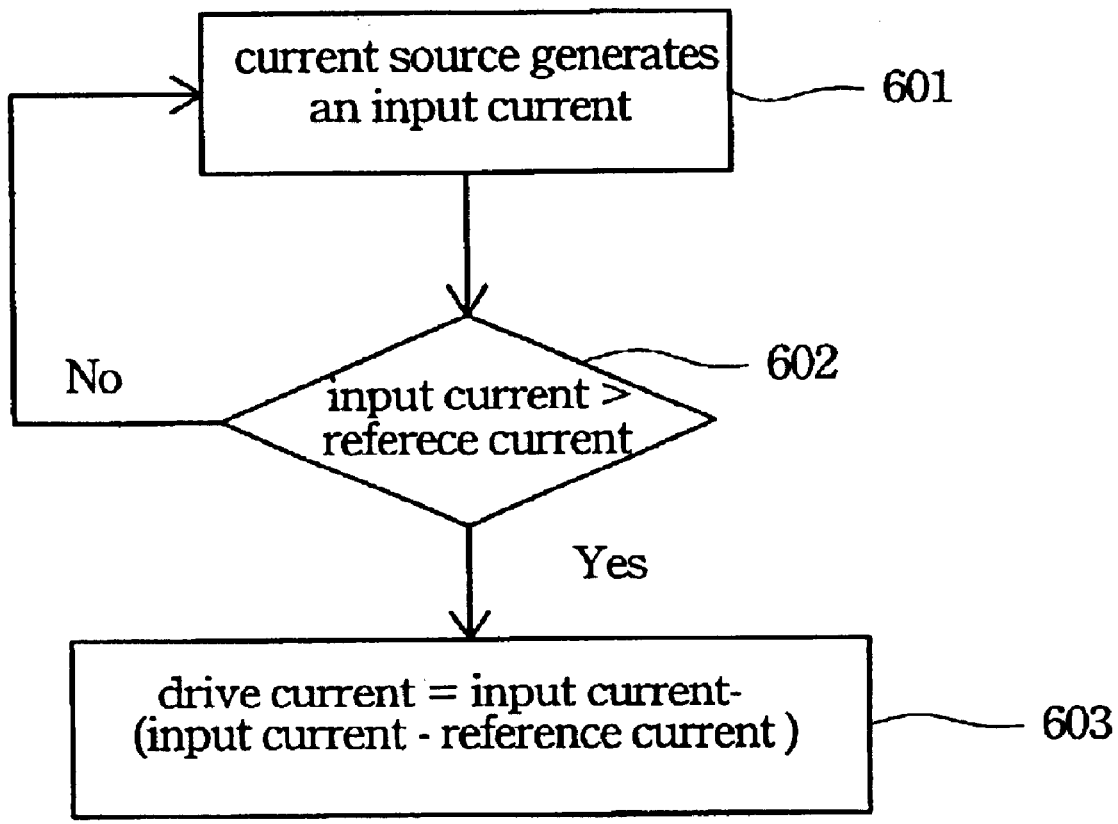
FIG. 6 is a flow chart of generating a drive current in the driver circuit in accordance with the preferred embodiment of the present invention.

FIG. 6 is a flow chart of generating a drive current to the driver circuit in accordance with the preferred embodiment of the present invention. The current source generates an input current in step 601. Then, the input current is compared with a reference current in step 602. If the input current is less than this reference current, step 601 is performed again to detect the current. If the input current is larger than this reference current, step 603 is performed. In step 603, a drive current is generated, in which the drive current is equal to the input current subtracting the current difference between the input current and the reference current.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structure.

What is claimed is:

1. A driver circuit having a specific output current and a specific input current, comprising:
   an input current limiting unit for generating said specific input current, wherein said input current limiting unit provides an additional circuit route for sinking current exceeding said specific input current;
   a load driver unit for receiving said specific input current from said input current limiting unit to generate a drive current to drive a load; and
   a dynamic adjustment and detection unit for detecting said drive current and transferring said drive current to a voltage signal, wherein the voltage signal is compared with a reference voltage, and said dynamically adjusting and detecting unit reduces said drive current in real time if said drive current is larger than said specific output current.

2. The driver circuit having a specific output current and a specific input current according to claim 1, wherein said input current limiting unit further comprises:
   first and second transistors, wherein the base electrode of said first and transistor and the base electrode of said second transistor are connected with a current source to generate a first current in the collector electrode of said first transistor and generate a second current in the collector electrode of said second transistor;
   a first current mirror, wherein an input current of said first current mirror is supplied by a reference current source and an output end of said first current mirror is connected with a collector electrode of said first transistor;
   a second current mirror respectively connected with the output end of said first current mirror and the collector electrode of said first transistor, wherein the input current of said second current mirror is equal to a difference between said first current and said reference current; and
   a specific current output end for outputting a specific current, wherein said specific current output end is respectively connected with the output end of said second current mirror and the collector electrode of said second transistor, and said specific current is equal to a difference between said second current and said input current of said second current mirror.

3. The driver circuit having a specific output current and a specific input current according to claim 2, wherein said specific current is said specific input current.

4. The driver circuit having a specific output current and a specific input current according to claim 2, wherein said first transistor and said second transistor use the same design rule.

5. The driver circuit having a specific output current and a specific input current according to claim 1, wherein said load driver unit further comprises:
   a Darlington pair for driving a load;
   a first transistor, wherein the base electrode is used to receive said specific input current and enlarge said specific input current in the emitter electrode; and
   a second transistor, wherein the base electrode is used to receive the current from the emitter electrode of said first transistor to generate a drive current in the collector electrode.

6. The driver circuit having a specific output current and a specific input current according to claim 5, wherein said load is a motor.

7. The driver circuit having a specific output current and a specific input current according to claim 5, wherein said dynamically adjusting and detecting unit further comprises:
- a third transistor, a base electrode thereof being connected with the base electrode of said second transistor, wherein a ratio relationship exists between the collector current of said second transistor and the collector current of said third transistor;
- an operation amplifier having a first input end connected with the collector end of said second transistor, second input end connected with the collector end of said third transistor and a first output end, wherein said operation amplifier ensures said second transistor and said third transistor have the same collector-emitter voltage;
- a current mirror whose input end is connected with the first output end of said operation amplifier and whose reference current is provided by the collector current of said third transistor, wherein a resistor is connected with the output end of said current mirror to convert a output current from said current mirror to a first voltage signal; and
- a comparator having a third input end for receiving said first voltage signal, a fourth input end for receiving a reference voltage and a second output end respectively connected with the base electrodes of said second transistor and said third transistor, wherein said comparator sinks the collector current of said second transistor if said drive current is larger than said specific output current.

8. The driver circuit having a specific output current and a specific input current according to claim 7, wherein said resistor is related to said specific output current.

9. A driver circuit having a specific output current and a specific input current, comprising:
- an input current limiting unit for generating said specific input current, wherein said input current limiting unit provides an additional circuit route for sinking the current exceeding said specific input current;
- a load driver unit comprising a first transistor and a second transistor for receiving said specific input current from said input current limiting unit to generate a drive current to drive a load, wherein the base electrode of said first transistor receives said specific input current and enlarges said specific input current in the emitter electrode, the enlarged specific input current is transferred to the base electrode of said second transistor and generates said drive current; and
- a dynamically adjusting and detecting unit comprising:
  - a third transistor, a base electrode thereof being connected with the base electrode of said second transistor, wherein a ratio relationship exists between the collector current of said second transistor and the collector current of said third transistor;
  - an operation amplifier having first input end connected with the collector end of said second transistor, second input end connected with the collector end of said third transistor and a first output end, wherein said operation amplifier ensures said second transistor and said third transistor have a same collector-emitter voltage;
  - a current mirror, an input end thereof being connected with the first output end of said operation amplifier and a reference current thereof being provided by the collector current of said third transistor, wherein a resistor is connected with the output end of said current mirror to transfer a output current from said current mirror to a first voltage signal; and
  - a comparator having a third input end for receiving said first voltage signal, a fourth input end for receiving a reference voltage and a second output end respectively connected with the base electrodes of said second transistor and said third transistor, wherein said comparator sinks the collector current of said second transistor if said drive current is larger than said specific output current.

10. The driver circuit having a specific output current and a specific input current according to claim 9, wherein said load is a motor.

11. The driver circuit having a specific output current and a specific input current according to claim 9, wherein said resistor is related to said specific output current.

12. A driver circuit having a specific output current and a specific input current, comprising:
- first and second transistors, wherein the base electrode of said first and transistor and the base electrode of said second transistor are connected with a current source to generate a first current in a collector electrode of said first transistor and generate a second current in a collector electrode of said second transistor;
- a first current mirror, wherein an input current of said first current mirror is supplied by a reference current source and an output end of said first current mirror is connected with the collector electrode of said first transistor;
- a second current mirror respectively connected with the output end of said first current mirror and the collector electrode of said first transistor, wherein the input current of said second current mirror is equal to a difference between said first current and said reference current;
- a specific current output end for outputting a specific current, wherein said specific current output end is respectively connected with the output end of said second current mirror and the collector electrode of said second transistor, and said specific current is equal to a difference between said second current and said input current of said second current mirror;
- a third transistor connected with said specific current output end, wherein the base electrode is used to receive said specific current and enlarge said specific current in the emitter electrode;
- a fourth transistor, wherein the base electrode is used to receive the current from the emitter electrode of said third transistor to generate a drive current in the collector electrode;
- a fifth transistor, a base electrode thereof being connected with the base electrode of said fourth transistor;
- an operation amplifier having a first input end connected with the collector end of said fourth transistor, a second input end connected with the collector end of said fifth transistor and a first output end, wherein said operation amplifier ensures said fourth transistor and said fifth transistor have the same collector-emitter voltage;
- a current mirror, an input end thereof being connected with the first output end of said operation amplifier and a reference current thereof being provided by the collector current of said fifth transistor, wherein a resistor is connected with the output end of said current mirror to transfer a output current from said current mirror to a first voltage signal; and
- a comparator having a third input end for receiving said first voltage signal, a fourth input end for receiving a reference voltage and a second output end respectively connected with the base electrodes of said fourth transistor and said fifth transistor, wherein said comparator sinks the collector current of said fourth transistor if said drive current is larger than said specific output current.

13. The driver circuit having a specific output current and a specific input current according to claim 12, wherein said specific current is said specific input current.

14. The driver circuit having a specific output current and a specific input current according to claim 12, wherein said first transistor and said second transistor use the same design rule.

15. The driver circuit having a specific output current and a specific input current according to claim 12, wherein said load is a motor.

16. The driver circuit having a specific output current and a specific input current according to claim 12, wherein said resistor is related to said specific output current.

17. A dynamically adjusting output current and limiting the input current method, wherein said method generates a specific output current and a specific input current, comprising:

providing an input current;

providing an additional current route to sink a current difference between said input and said specific input current to ensure said input current is equal to said specific input current;

using said specific input current to generate a drive current to drive a load; and detecting said drive current and converting said drive current to a voltage signal for comparison with a reference voltage, wherein the drive current is reduced in real time if said drive current is larger than said specific output current.

18. An apparatus for generating a special current comprising:

first and second transistors, wherein a base electrode of said first transistor and a base electrode of said second transistor are connected with a current source to generate a first current in the collector electrode of said first transistor and generate a second current in the collector electrode of said second transistor;

a first current mirror, wherein a reference current source provides a reference current to serve as an input current of said first current mirror and the output end of said first current mirror is connected with the collector electrode of said first transistor;

a second current mirror respectively connected with the output end of said first current mirror and the collector electrode of said first transistor, wherein the input current of said second current mirror is equal to a difference between said first current and said reference current; and a specific current output end for outputting said specific current, wherein said specific current output end is respectively connected with the output end of said second current mirror and the collector electrode of said second transistor, and said specific current is equal to the difference between said second current and said input current of said second current mirror.

19. The driver circuit having a specific output current and a specific input current according to claim 18, wherein said first transistor and said second transistor use a same design rule.

20. A dynamically adjusting output current apparatus comprising:

a output unit comprising a first transistor, wherein a collector electrode of said first transistor outputs said output current;

a second transistor, a base electrode thereof being connected with the base electrode of said first transistor;

an operation amplifier having a first input end connected with the collector electrode of said first transistor, a second input end connected with the collector electrode of said second transistor and a first output end, wherein the base electrode of said first transistor is connected with the base electrode of said second transistor;

a current mirror, an input end thereof being connected with the first output end of said operation amplifier and a reference current thereof being provided by the collector current of said third transistor, wherein a resistor is connected with the output end of said current mirror to transfer an output current from said current mirror to a first voltage signal; and a comparator having a third input end for receiving said first voltage signal, a fourth input end for receiving a reference voltage and a second output end respectively connected with the base electrodes of said first transistor and said second transistor, wherein said comparator sinks the collector current of said second transistor if said drive current is larger than said specific output current.

21. The dynamically adjusting output current apparatus according to claim 20, wherein a ratio relationship exists between the collector currents of said second transistor and said third transistor.

* * * * *